United States Patent [19]

Kim

[11] Patent Number: 5,643,832

[45] Date of Patent: Jul. 1, 1997

[54] SEMICONDUCTOR DEVICE AND METHOD FOR FABRICATION THEREOF

[75] Inventor: Jae Kap Kim, Kyoungki-do, Rep. of Korea

[73] Assignee: Hyundai Electronics Industries Co., Ltd., Rep. of Korea

[21] Appl. No.: 374,847

[22] Filed: Jan. 19, 1995

[30] Foreign Application Priority Data

Jan. 19, 1994 [KR] Rep. of Korea .................. 94-973

[51] Int. Cl.$^6$ .................................................. H01L 21/44
[52] U.S. Cl. .................................... 437/187; 437/203
[58] Field of Search ............................. 437/187, 203, 437/35, 52

[56] References Cited

U.S. PATENT DOCUMENTS 5,077,228  12/1991  Eklund et al. ......................... 437/40
5,455,190  10/1995  Hsu ......................................... 437/40

FOREIGN PATENT DOCUMENTS 63-55960   3/1988  Japan .
3-227065  10/1991  Japan .

*Primary Examiner*—John Niebling
*Assistant Examiner*—C. Everhart
*Attorney, Agent, or Firm*—Morgan & Finnegan LLP

[57] ABSTRACT

There are disclosed a semiconductor device and a fabrication process thereof. The semiconductor device comprises a trench contact hole which goes through a source electrode of MOSFET to a semiconductor substrate, and a conductive wire filled in the trench contact hole. A substrate electrode is formed underneath the trench contact hole and thus, electrically connected with the source electrode by the conductive wire. Accordingly, the semiconductor device is very reduced in the connection part between the source electrode and the substrate electrode and can be applied for accomplishment of high integration of semiconductor device.

5 Claims, 3 Drawing Sheets

SEMICONDUCTOR DEVICE AND METHOD FOR FABRICATION THEREOF

BACKGROUND OF THE INVENTION

1. Field of the Invention

The present invention relates, in general, to a semiconductor device and, more particularly, to a semiconductor device reduced in its occupying area. Also, the present invention is concerned with a process for fabricating the semiconductor device.

2. Description of the Prior Art

High integration of semiconductor device is accomplished with a great diminution in the area that is occupied by unit cell. An element of MOSFET, which occupies the most area in an integrated circuit of semiconductor device, is structured to have a source electrode connected with a substrate electrode in the integrated circuit.

In order to better understand of the background of the present invention, a description will be given for conventional technique with reference to some drawings.

FIG. 1A is a typical circuit diagram of PMOS in an integrated circuit. As shown in this figure, $V_{DD}$ is connected with a source electrode of PMOS and a substrate electrode while a drain of PMOS is grounded or connected with another electrode.

FIG. 1B is a typical circuit diagram of NMOS in an integrated circuit. As shown in FIG. 1B, $V_{ss}$ is connected with a source electrode of NMOS and a substrate electrode while a drain of NMOS is connected with $V_{cc}$ or another electrode.

Referring to FIG. 2, there is shown the PMOS of FIG. 1A fabricated oh a semiconductor device in a conventional technique. As shown in this figure, a semiconductor substrate 100 is provided with an N-well 10. Element isolation insulating layers 2 are formed on predetermined areas of the semiconductor substrate 1, so as to divide the semiconductor substrate into active regions and field regions. Then, a gate oxide 3 and a gate electrode 4 are in sequence formed on each of the active regions. Using this gate structure as a mask, P type impurities are implanted into the P-well, to form a source electrode 15A and a drain electrode 15B. Thereafter, impurities having the same type with the well, that is, P type impurities are implanted into a region isolated by the element isolation insulating layers, to form a substrate electrode 15C. Next, a blanket interlayer insulating layer 6 is formed over the resulting structure and then, subjected to selective etch, to form three contact holes which expose the source electrode 15A, the drain electrode 15B and the substrate electrode 15C. In order to interconnect the source electrode 15A with the substrate electrode 15C, a conductive wire 35A is formed filling the two contact holes. On the other hand, another conductive wire 35B is formed in order to come into contact with the drain electrode 15B.

As mentioned above, such conventional semiconductor device comes to has increased unit area because an additional substrate electrode is formed in an additional active region adjacent to the active region in which a source electrode and correspondingly, contact holes has to be formed for the contact with the substrate electrodes.

Consequently, it is virtually impossible to reduce the active region for source electrode with the prior technique in consideration of many hindrances, such as a reticle registration among a mask for source electrode, a mask for substrate electrode and a mask for gate electrode, a misalignment tolerance upon masking and a CD tolerance.

SUMMARY OF THE INVENTION

Therefore, an object of the present invention is to overcome the above problems encountered in prior arts and to provide a semiconductor device reduced in unit area.

Another object of the present invention is to provide a process for fabricating the semiconductor device.

In accordance with an aspect of the present invention, there is provided a semiconductor device comprising: a MOSFET consisting of a substrate and a gate electrode, source electrode and a drain electrode; an interlayer insulating layer deposited over said MOSFET; a trench contact hole which goes through said interlayer insulating layer and said source electrode to an area of said substrate; a substrate electrode formed underneath said trench contact hole, being the same with said substrate in impurity type; and a conductive wire filled in said trench contact hole, said source electrode and said substrate being electrically connected with each other through said conductive wire.

In accordance with another aspect of the present invention, there is provided a process for the fabrication of semiconductor device, comprising the steps of: forming a MOSFET structure consisting of a gate oxide, a gate electrode, a source electrode and a drain electrode on an active region of a semiconductor device; forming an interlayer insulation layer over the MOSFET structure; selectively etching an area of said interlayer insulating layer, said source electrode and said substrate, to form a trench contact hole; forming a substrate electrode underneath said trench contact hole, said substrate electrode being the same with said substrate in impurity type; and filling said trench contact hole with a conductive wire, to interconnect said substrate electrode with said source electrode.

BRIEF DESCRIPTION OF THE DRAWINGS

The above objects and other advantages of the present invention will become mole apparent by describing in detail the preferred embodiments of the present invention with reference to the attached drawings in which.

DETAILED DESCRIPTION OF THE PREFERRED EMBODIMENTS

Figure 1A:
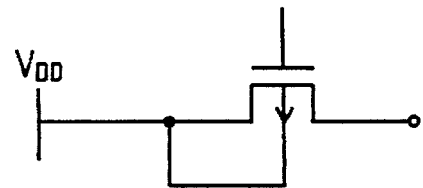
FIG. 1A is a circuit diagram showing a source electrode electrically connected with $V_{DD}$ in an integrated circuit of semiconductor device.
Figure 1B:
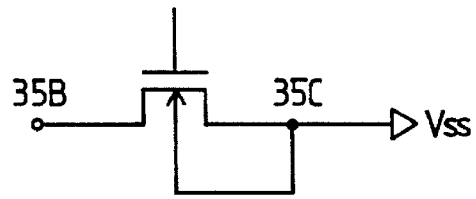
FIG. 1B is a circuit diagram showing a source electrode electrically connected with $V_{ss}$ in an integrated circuit of semiconductor device.
Figure 2:
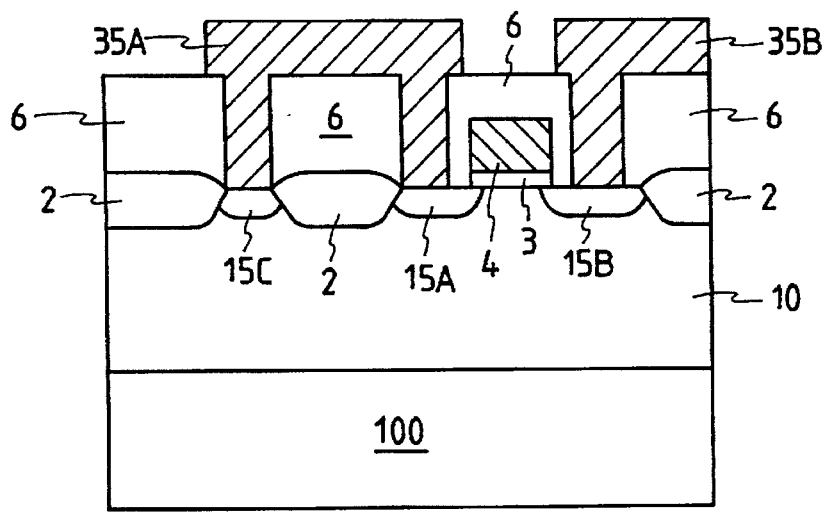
FIG. 2 is a schematic cross sectional view showing a semiconductor device of FIG. 1A fabricated in a conventional technique.

The application of the preferred embodiments of the present invention is best understood with reference to the accompanying drawings, wherein like reference numerals are used for like and corresponding parts, respectively.

Figure 3A:
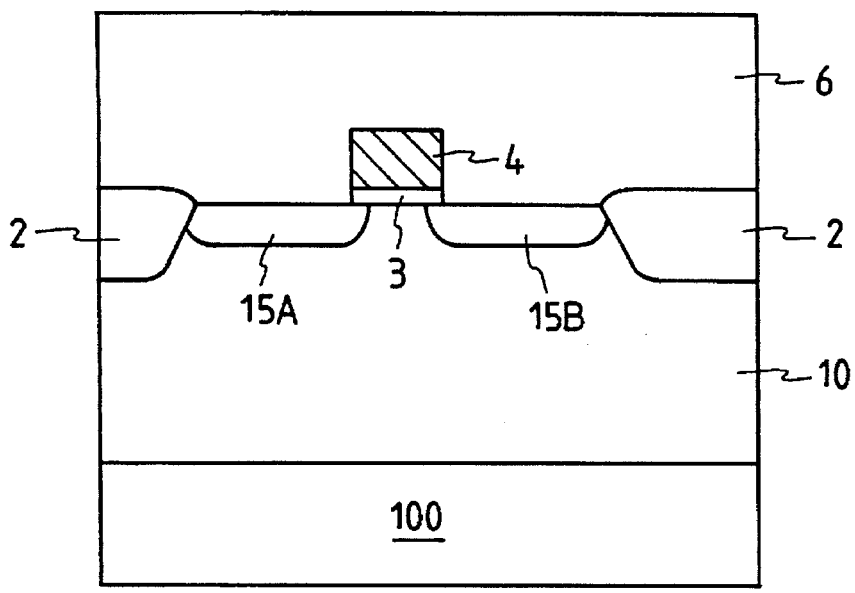
FIGS. 3A through 3C are schematic cross sectional views illustrating a process for fabricating a semiconductor device of FIG. 1A, according to the present invention.
Figure 3B:
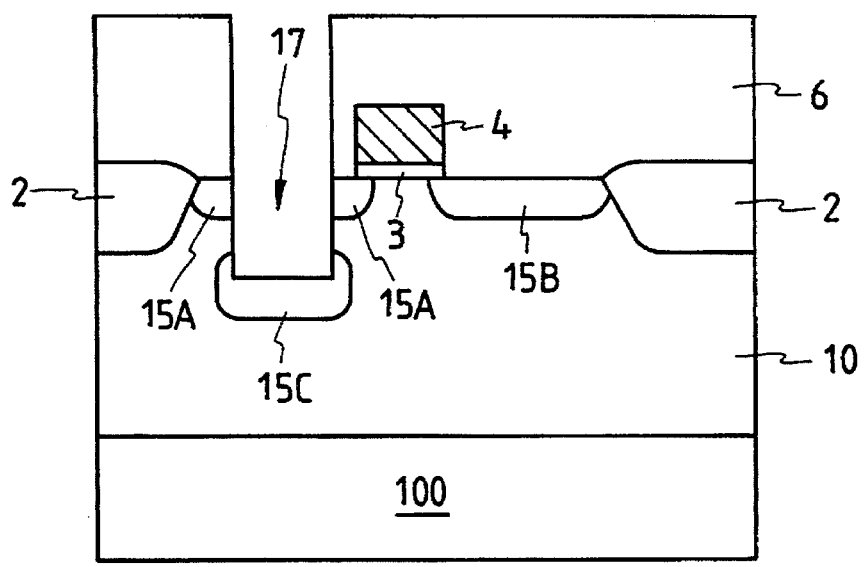
Figure 3C:
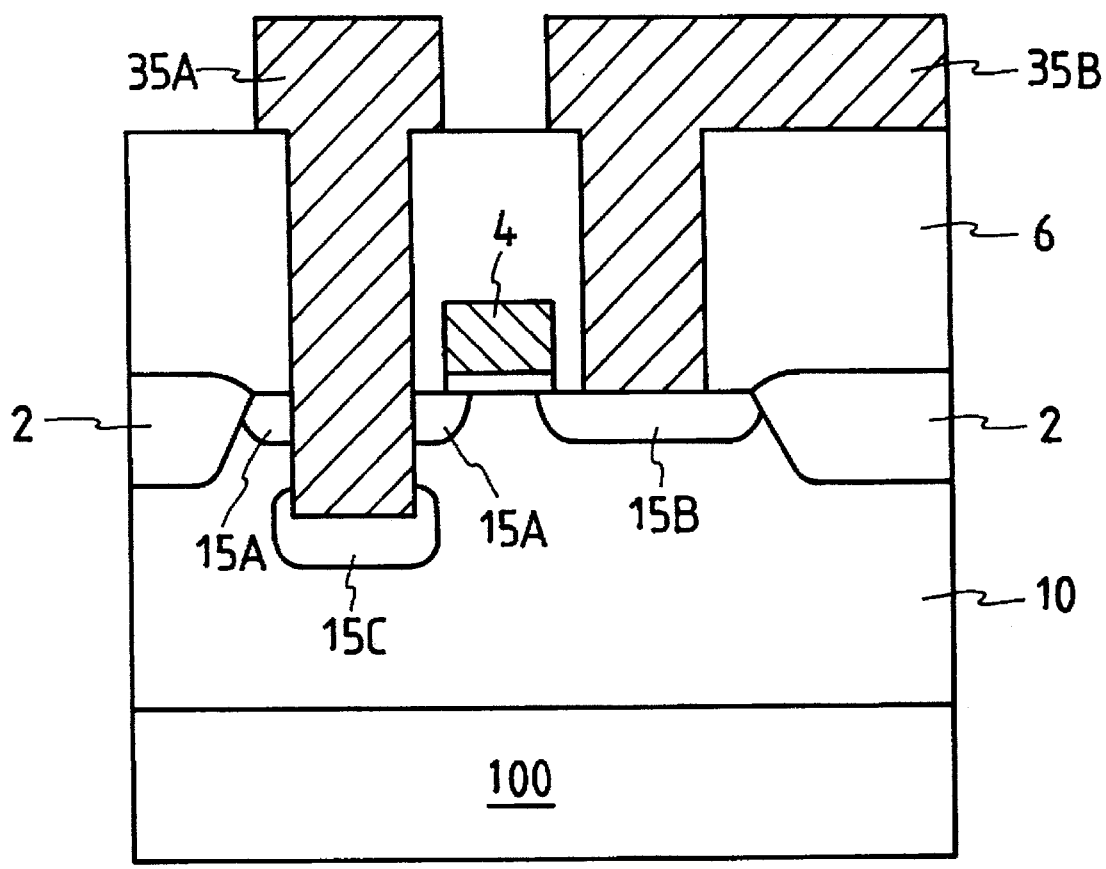

FIG. 3 shows the preferred process steps for fabricating a semiconductor device of the PMOS of FIG. 1A on a semiconductor substrate, according to the present invention. These preferred process steps will be in great detail described in connection with FIGS. 3A through 3C.

First, as Shown in FIG. 3A, there is formed a PMOS transistor. For this, a semiconductor substrate 100 is initially provided with an N-well 10. On a predetermined area of the N-well 10 is formed an element isolation insulating layer 2, in order to divide the substrate. A gate oxide layer 3 is formed over the active region thus divided, followed by formation of a gate electrode 4 on the gate oxide layer 3. Using the gate structure as a mask, P-type dopants are implanted into the active region, to form a source electrode 15A and a drain electrode 15B in the N-well. As a result, a PMOS transistor is obtained. Then, this PMOS transistor structure is covered with a blanket interlayer insulating layer 6, for example, boro-phospho-silicate glass (BPSG).

FIG. 3B is a cross section of the semiconductor device after a trench contact hole 17 is formed, followed by formation of a substrate electrode 15C underneath the trench contact hole 17. For the trench contact hole 17, a selective etch step is undertaken by use of a contact mask (not shown) until an area of the N-well 10 is taken off. In this selective etch, an area of the interlayer insulating layer 6 and the source electrode 15A thereon are also eliminated. As a result, the trench contact hole 17 goes through the interlayer insulating layer 6 and the source electrode 15A to the N-well 10 and has a depth of approximately 0.1 to approximately 0.5 μm. Thereafter, the same type dopants as the N-well, that is, N-type dopants are implanted into the exposed area of the N-well 10, to form the substrate electrode 15C underneath the trench contact hole 17.

FIG. 3C is a cross section of the semiconductor device after a contact hole is formed exposing the drain electrode 15B, followed by filling the contact holes with conductive wires 35A, 35B. As a result, the source electrode 15A is electrically connected with the substrate electrode 15C by the conductive wire 35A which fills the trench contact hole 17.

As described hereinbefore, the substrate electrode is formed underneath the trench contact hole which goes through the source electrode of MOSFET device to the substrate, so as to reduce the area of the semiconductor device with ease, and the substrate electrode and the source electrode are electrically connected with each other by a conductive wire deposited in the contact hole, thereby improving the degree of integration of semiconductor device.

It should be noted that the present invention described above can be applied for formation of NMOS in a P type substrate or a P-well.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A process for the fabrication of semiconductor device, comprising the steps of:

forming a MOSFET structure comprising a gate oxide, a gate electrode, a source electrode and a drain electrode on an active region of a semiconductor device;

forming an interlayer insulation layer over the MOSFET structure;

selectively etching an area of said interlayer insulating layer, said source electrode and said substrate, to form a trench contact hole;

forming a substrate electrode underneath said trench contact hole, said substrate electrode being the same as said substrate in conductivity type; and filling said trench contact hole with a conductive wire, to interconnect said substrate electrode with said source electrode.

2. A process in accordance with claim 1, wherein said substrate electrode is opposite to both the source electrode and the drain electrode in conductivity type.

3. A process in accordance with claim 1, further comprising the step of forming in said substrate a well which is the same type as said substrate electrode in conductivity type, in advance of formation of the MOSFET structure.

4. A process in accordance with claim 1, wherein said trench contact hole is approximately 0.1 to approximately 0.5 μm deep.

5. A process for the fabrication of semiconductor device, comprising the steps of:

forming a MOSFET structure comprising a gate oxide, a gate electrode, a source electrode and a drain electrode on an active region of a semiconductor device;

forming an interlayer insulation layer over the MOSFET structure;

selectively etching an area of said interlayer insulating layer, said source electrode and said substrate, to form a trench contact hole;

forming a substrate electrode underneath said trench contact hole, said substrate electrode being the same as said substrate in conductivity type;

selectively etching an area of said interlayer insulating layer, to form a contact hole exposing said drain electrode therethrough; and filling said trench contact hole and said contact hole with respective conductive wires, to interconnect said substrate electrode with said source electrode and to bring said drain electrode into contact with said conductive wire.

* * * * *